(12) United States Patent
Prajuckamol et al.

(10) Patent No.: US 12,394,692 B2
(45) Date of Patent: Aug. 19, 2025

(54) POWER CIRCUIT MODULE

(71) Applicant: SEMICONDUCTOR COMPONENTS INDUSTRIES, LLC, Phoenix, AZ (US)

(72) Inventors: Atapol Prajuckamol, Thanyaburi (TH); Chee Hiong Chew, Seremban (MY); Olaf Zschieschang, Sinsheim (DE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 409 days.

(21) Appl. No.: 17/817,736

(22) Filed: Aug. 5, 2022

(65) Prior Publication Data

US 2023/0052830 A1    Feb. 16, 2023

Related U.S. Application Data

(60) Provisional application No. 63/260,171, filed on Aug. 11, 2021.

(51) Int. Cl.
*H01L 23/498*    (2006.01)
*H01L 21/48*    (2006.01)
(Continued)

(52) U.S. Cl.
CPC ...... *H01L 23/4924* (2013.01); *H01L 21/4853* (2013.01); *H01L 21/4875* (2013.01);
(Continued)

(58) Field of Classification Search
CPC ............. H01L 23/4924; H01L 21/4853; H01L 21/4875; H01L 23/3735; H01L 23/49811; H01L 23/49844; H01L 24/40; H01L 24/48; H01L 25/072; H01L 2224/40139; H01L 2224/40227; H01L 2224/40247; H01L 2224/48139; H01L 2224/48227; H01L 2224/48247; H01L 2924/10253; H01L 2924/10272; H01L 2924/13055; H01L 2924/13091; H01L 24/84; H01L 24/85; H01L 24/37; H01L 2224/37011; H01L 2924/00014; H01L 24/06; H01L 2224/04042; H01L 2224/40225; H01L 2224/0603; H01L 2224/49111; H01L 2224/49113; H01L 24/49; H01L 24/45; H01L 2224/45124; H01L 2224/45147;
(Continued)

(56) References Cited

U.S. PATENT DOCUMENTS 7,791,208 B2    9/2010    Bayerer
2006/0290689 A1    12/2006    Grant et al.
(Continued)

*Primary Examiner* — Elias Ullah
(74) *Attorney, Agent, or Firm* — Brake Hughes Bellermann LLP

(57) ABSTRACT

A circuit module includes a substrate with a patterned metal surface. The patterned metal surface includes a conductive terminal pad, a first conductive pad, and a second conductive pad that is non-adjacent to the conductive terminal pad. A first circuit portion is assembled on the first conductive pad and a second circuit portion is assembled on the second conductive pad. A conductive bridge electrically couples the conductive terminal pad and the second conductive pad. The conductive bridge includes an elevated span extending above and across the first conductive pad.

16 Claims, 11 Drawing Sheets

(51) Int. Cl.
*H01L 23/00* (2006.01)
*H01L 23/373* (2006.01)
*H01L 23/492* (2006.01)
*H01L 25/07* (2006.01)

(52) U.S. Cl.
CPC .... *H01L 23/3735* (2013.01); *H01L 23/49811* (2013.01); *H01L 23/49844* (2013.01); *H01L 24/40* (2013.01); *H01L 24/48* (2013.01); *H01L 25/072* (2013.01); H01L 2224/40139 (2013.01); H01L 2224/40227 (2013.01); H01L 2224/40247 (2013.01); H01L 2224/48139 (2013.01); H01L 2224/48227 (2013.01); H01L 2224/48247 (2013.01); H01L 2924/10253 (2013.01); H01L 2924/10272 (2013.01); H01L 2924/13055 (2013.01); H01L 2924/13091 (2013.01)

(58) Field of Classification Search
CPC . H01L 2224/73221; H01L 2924/30107; H01L 12/585; H01L 12/718; H01R 12/585; H01R 12/718
See application file for complete search history.

(56) References Cited

U.S. PATENT DOCUMENTS

| | | | |
|---|---|---|---|
| 2016/0181221 A1* | 6/2016 | Sunaga | H01L 25/18 257/401 |
| 2017/0345799 A1 | 11/2017 | Rowden et al. | |
| 2019/0051636 A1 | 2/2019 | Tonedachi | |

* cited by examiner

POWER CIRCUIT MODULE

RELATED APPLICATION

This application claims the benefit of U.S. Provisional Application No. 63/260,171, filed on Aug. 11, 2021, which is hereby incorporated by reference in its entirety herein.

TECHNICAL FIELD

This description relates to packaging of semiconductor die and integrated circuits.

BACKGROUND

Modern high-power devices are fabricated in semiconductor die. High-power devices that can deliver or switch high levels of power can be used in power circuits for, for example, vehicles powered by electricity (e.g., Electric vehicles (EVs), hybrid electric vehicles (HEVs) and plug-in-electric vehicles (PHEV)). The power devices can be fabricated in semiconductor die. Typically, the power device dies are mounted on a substrate to form a circuit and enclosed in a power module package. Packaging technologies for a power module package can include lead frame, die attach, electrical interconnections, and encapsulation. Power module pins attached to the substrate and extending through the power module package can form the external electrical connections (e.g., power supply, signal, and ground leads (terminals)) to the enclosed circuit.

SUMMARY

In a general aspect, a circuit module includes a substrate with a patterned metal surface. The patterned metal surface includes a conductive terminal pad, a first conductive pad, and a second conductive pad that is non-adjacent to the conductive terminal pad. A first circuit portion is assembled on the first conductive pad and a second circuit portion is assembled on the second conductive pad. A conductive bridge electrically couples the conductive terminal pad and the second conductive pad. The conductive bridge includes an elevated span extending above and across the first conductive pad.

In a general aspect, a power circuit package includes bilaterally symmetric arrangement of a plurality of conductive pads disposed on a surface of a substrate. The plurality of conductive pads includes a conductive terminal pad disposed in an edge portion of the substrate along a top edge of the substrate, a first conductive pad disposed in an upper portion of the substrate next to the edge portion, and a second conductive pad disposed in a lower portion of the substrate next to the upper portion. A first sub circuit is assembled on the first conductive pad and a second sub circuit is assembled on the second conductive pad. A conductive bridge couples the conductive terminal pad and the second conductive pad. The conductive bridge including a span extending above the first conductive pad and the first sub circuit assembled on the first conductive pad.

In a general aspect, a method for assembling a power circuit module includes patterning a metal surface of a substrate to form an arrangement of a plurality of conductive pads that is bilaterally symmetric about a median axis of the substrate. The plurality of conductive pads are electrically isolated from each other. The method further includes disposing at least one first semiconductor device on a first conductive pad on the substrate and disposing at least one second semiconductor device on a second conductive pad on the substrate. The method further includes coupling at least one source electrode of the at least one first semiconductor device to a third conductive pad on the substrate and coupling at least one source electrode of the at least one second semiconductor device to the first conductive pad on the substrate. The method also includes connecting, using a conductive bridge, the second conductive pad on the substrate to a fourth conductive pad on the substrate that is not adjacent to the second conductive pad on the substrate.

The details of one or more implementations are set forth in the accompanying drawings and the description below. Other features will be apparent from the description and drawings, and from the claims.

Figure 1A:
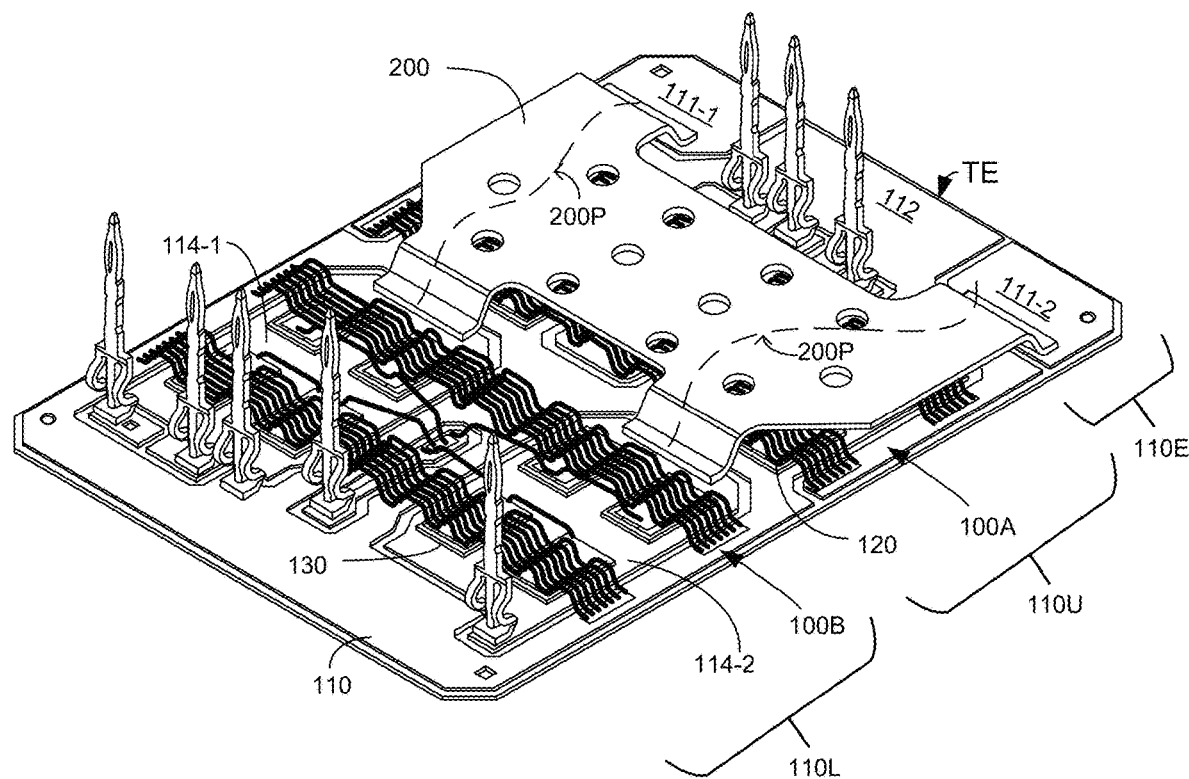
FIG. 1A illustrates a perspective top view of an example power circuit assembled on a substrate.

In the various drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are repeated for context and ease of cross reference between related views. Also, not all like elements in the drawings may be specifically referenced with a reference symbol when multiple instances of an element are illustrated.

DETAILED DESCRIPTION

For modern electronic circuit applications, various semiconductor die or integrated circuit (IC) chips (e.g., metal-oxide-semiconductor field-effect transistor (MOSFET), insulated-gate bipolar transistors (IGBT), high-side and low-side FET switches or drivers, or controller IC chips, etc.) and other discrete circuit elements or devices (e.g., resistors, inductors, diodes) may be included in a circuit. The various semiconductor die, and devices may be fabricated in any type of semiconductor material (e.g., silicon, silicon carbide, etc.).

An example circuit may be traditionally constructed by using a lateral placement of the circuit components and devices (e.g., MOSFETs, silicon carbide MOSFETs, controller die (IC chips), diode, thermistors, etc.) on a patterned metal surface of a substrate (e.g., a printed circuit board, a direct bonded metal (DBM) substrate, etc.). A circuit device (e.g., a MOSFET) may, for example have a backside drain contact, and source and gate contacts on a frontside (or top side) of the circuit device. In example implementations, the circuit device (e.g., MOSFET) may be placed on the substrate with its backside drain in contact with the patterned metal surface.

The patterned metal surface of the substrate may include different patterned electrically conductive areas (e.g., conductive pads and traces). The different patterned areas can include conductive pads (e.g., a first conductive pad and a second conductive pad) on which the circuit components and devices can be placed. The different patterned areas can also include conductive terminal pads (e.g., a DC+ terminal pad, a DC− terminal pad) that can be attached, for example, to external power terminals (e.g., a DC+ terminal, a DC− terminal). The different patterned areas (e.g., conductive pads and traces) can be mutually isolated from each other. The conductive pads (including the conductive terminal pads) can include a pair of conductive pads that are not adjacent (i.e., not contiguous) to each other. For example, at least one of the conductive terminal pads may be non-adjacent (i.e., not contiguous) to at least one of the conductive pads (e.g., the first conductive pad, the second conductive pad) on which the circuit components and devices are placed.

Various circuit components and devices corresponding to different parts or portions of the circuit may be placed on correspondingly different conductive pads of the patterned metal surface of the substrate. For example, MOSFETs of a power sub circuit corresponding to high-side FET switches may be placed (drain-side down) on the first conductive pad and MOSFETs of power sub circuit corresponding to low-side FET switches may be placed (drain-side down) on the second conductive pad.

The substrate may be packaged in a circuit package with external terminals (e.g., power terminals, DC terminals, AC terminals, input/output signal terminals) attached to at least one of the conductive pads. The external terminals may be configured to transmit power and or electrical signals to and from the circuit in the circuit package.

Printed traces and conductive pads in the patterned metal surface of the substrate can provide electrical connections (e.g., wiring) between the circuit components and devices, and connections to the external terminals (e.g., power terminals, input/output signal terminals, control signal terminals, etc.) of the circuit package. For example, a backside drain of a device (e.g., a MOSFET) may be electrically connected via the conductive pad (e.g., the first conductive pad or the second conductive pad) on which the MOSFET is placed. Further, wire bonds (or connector clips) can provide electrical connections to the top sides of the circuit components and devices. For example, the top side source and gate contacts of a device (e.g., a MOSFET) may be interconnected by wire bonds to the top side of an adjacent device (e.g., another MOSFET) or to an adjacent trace in the patterned metal surface of the substrate.

Further, in accordance with the principles of the present disclosure, a conductive bridge can provide electrical connection between a conductive pad and a distant (i.e., non-adjacent) conductive pad in the patterned metal surface of the substrate.

At a first end, the conductive bridge may rise in height from the conductive pad (e.g., a third conductive pad or a conductive terminal pad) above an adjacent conductive pad (e.g., a first conductive pad), and extend over and above the adjacent conductive pad (e.g., the first conductive pad). At a second end, the conductive bridge may drop in height from above the adjacent conductive pad (e.g., the first conductive pad) to contact the distant (non-adjacent) conductive pad (e.g., the second conductive pad).

In the implementations described herein, the substrate (used in circuit package with external terminals) may, for example, have a rectangular shape. The substrate can have, for example, a rectangular shape with a height H and a width W. The patterned metal surface of the substrate may include at least two conductive pads (i.e., conductive terminal pads) that can be connected (e.g., soldered to, or mechanically attached) to at least two external power terminals (e.g., a DC+ power terminal and a DC− power terminal) of the circuit package, respectively. The at least two conductive pads (i.e., conductive terminal pads) may be disposed along a top edge of the rectangular shape of the substrate. In the implementations described herein, a first conductive terminal pad may, for example, be attached to the DC+ power terminal, and a second conductive terminal pad may, for example, be attached to the DC− power terminal.

Further, the first conductive pad (e.g., an adjacent conductive pad) may be disposed in at least an upper portion of the substrate next to the top edge of the substrate, and the second conductive pad (i.e., a non-adjacent conductive pad) may be disposed in a lower portion of the substrate away from the top edge of the substrate. The first conductive pad (i.e., the adjacent conductive pad) in the upper portion of the substrate may be adjacent to the second conductive terminal pad. The second conductive pad (i.e., a non-adjacent conductive pad) in the lower portion of the substrate may be distant from (i.e., not adjacent to, or not contiguous with) at least the first conductive terminal pad. For example, the second conductive pad may be spatially separated from the first conductive terminal pad by portions of the second conductive terminal pad and or the first conductive pad.

FIGS. 1A through 5B illustrate aspects of a power circuit and power circuit packages constructed in accordance with the principles of the present disclosure.

The power circuit (e.g., circuit 100) may, for example, be a half bridge circuit. The power circuit (e.g., circuit 100) may be assembled on a patterned metal surface of a substrate 110 (e.g., a DBM substrate). FIG. 1A shows a perspective top view of a power circuit (e.g., circuit 100) assembled on a substrate 110. Circuit 100 may, for example, include a first circuit portion (e.g., a sub circuit 100A) and a second circuit portion (e.g., a sub circuit 100B). The first circuit portion (e.g., sub circuit 100A) and a second circuit portion (e.g., sub circuit 100B) may be assembled by mounting and interconnecting semiconductor die (e.g., device 120 and device 130) on mutually isolated conductive pads in an upper portion 110U and a lower portion 110L of the substrate, respectively. The first circuit portion (e.g., sub circuit 100A) may, for example, be assembled on a first conductive pad (e.g., conductive pad 113) in the upper portion 110U, and the second circuit portion (e.g., sub circuit 100B) may be assembled on a second conductive pad (e.g., conductive pad 114-1, conductive pad 114-2) in the lower portion 110L.

The first conductive pad (e.g., conductive pad 113) in the upper portion 110U, and the second conductive pad (e.g., conductive pad 114-1, 114-2) in the lower portion 110L are also mutually isolated from the conductive pads (e.g., conductive terminal pad 111-1, conductive terminal pad 111-2, and conductive terminal pad 112) formed in an edge portion 110E of the substrate (formed along a top edge (e.g., edge TE) of the substrate).

As shown in in FIG. 1A, a conductive bridge 200 that extends above the first circuit portion (e.g., sub circuit 100A) provides an electrical connection path (e.g., path 200P) between a conductive pad (e.g., conductive terminal pad 111-1, conductive terminal pad 111-2) formed in an edge portion 110E of the substrate and the second conductive pad (e.g., conductive pad 114-1, 114-2) in the lower portion 110L on which the second circuit portion (e.g., sub circuit 100B) is assembled.

Figure 1B:
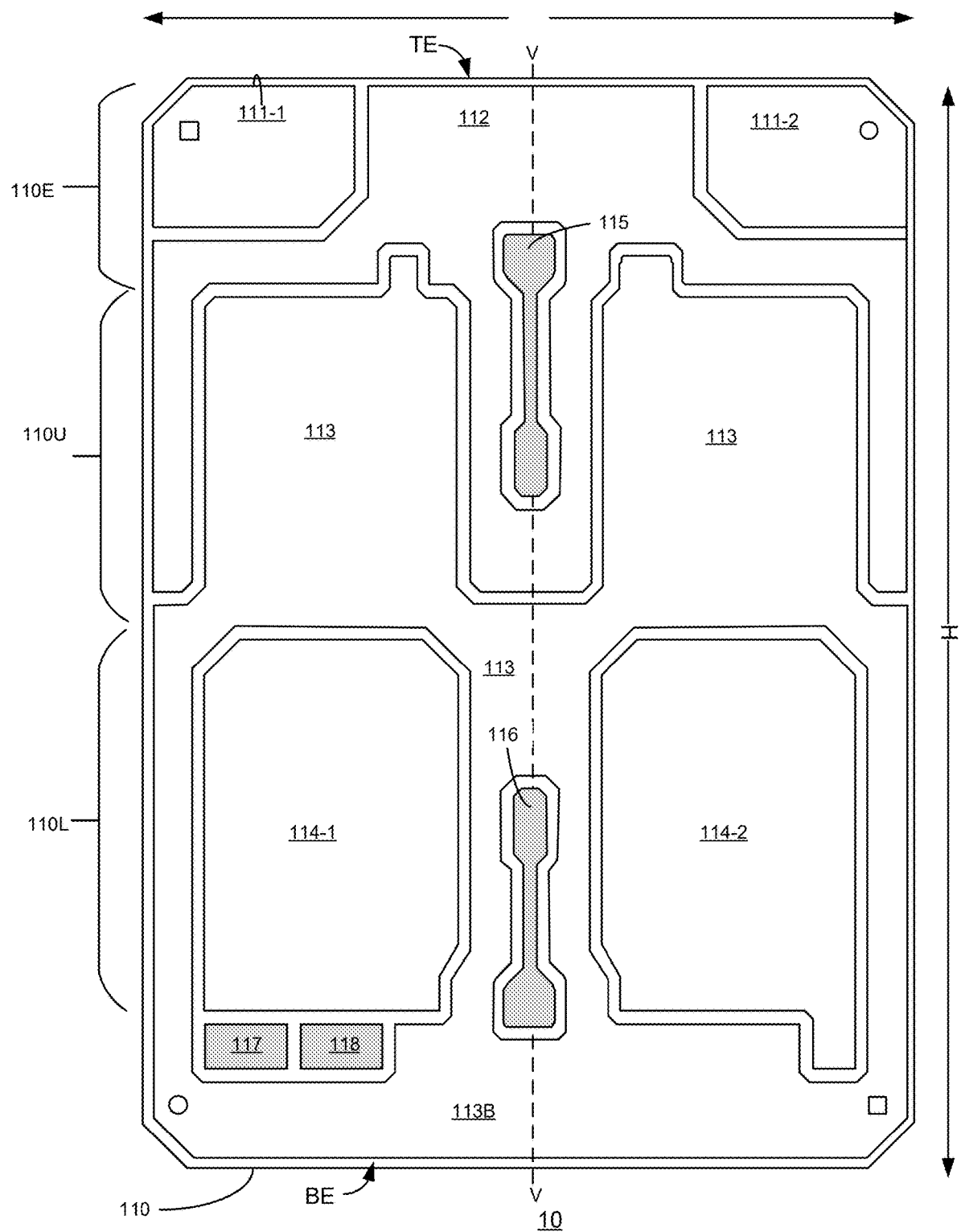
FIG. 1B illustrates an example layout of conductive pads formed on a substrate.
Figure 1C:
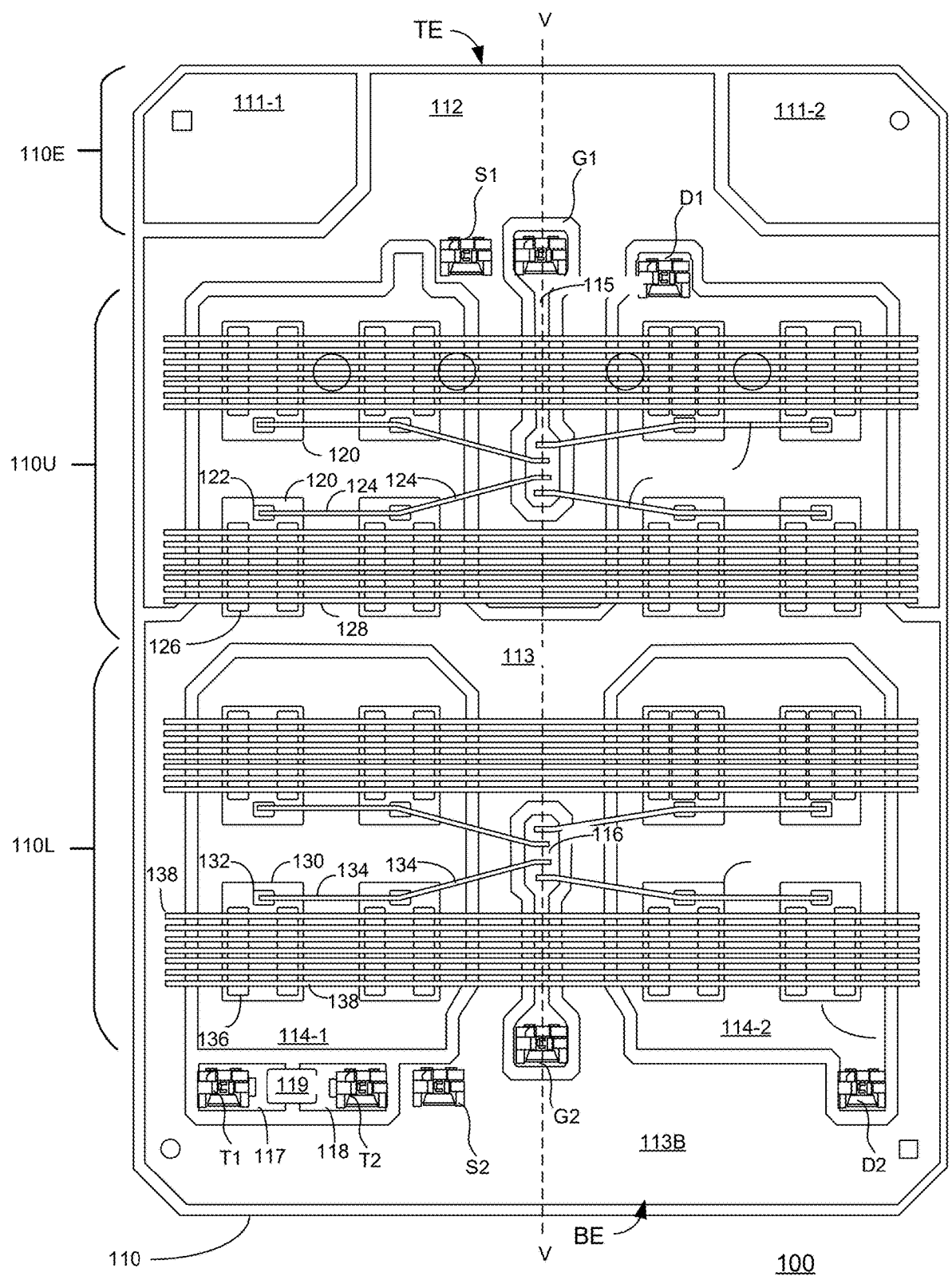
FIG. 1C illustrates a top view of an example substrate after devices and components of a circuit are assembled on the substrate.
Figure 1D:
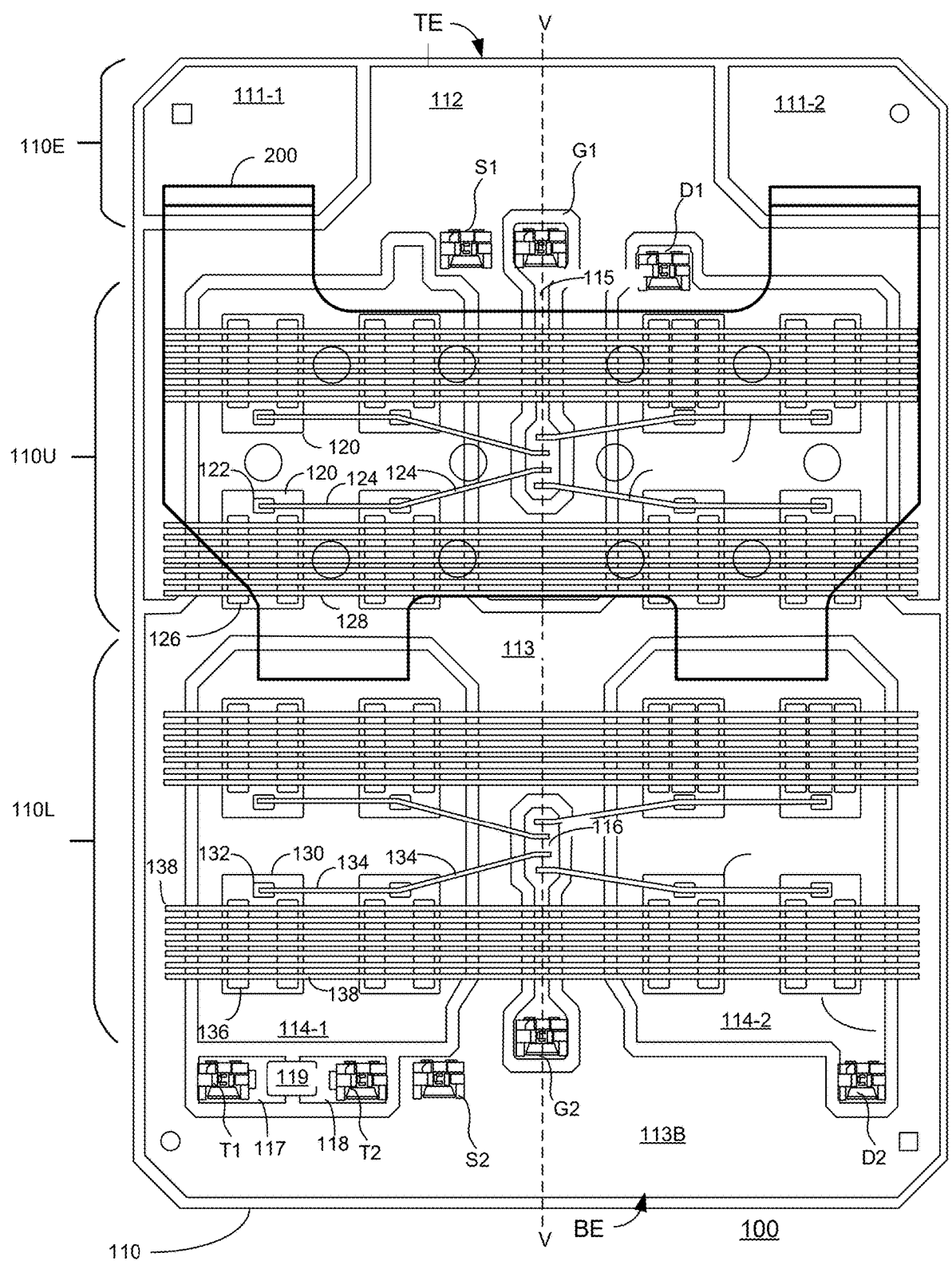
FIG. 1D illustrates a top view of the circuit of FIG. 1C after a conductive bridge is attached to the substrate.
Figure 1E:
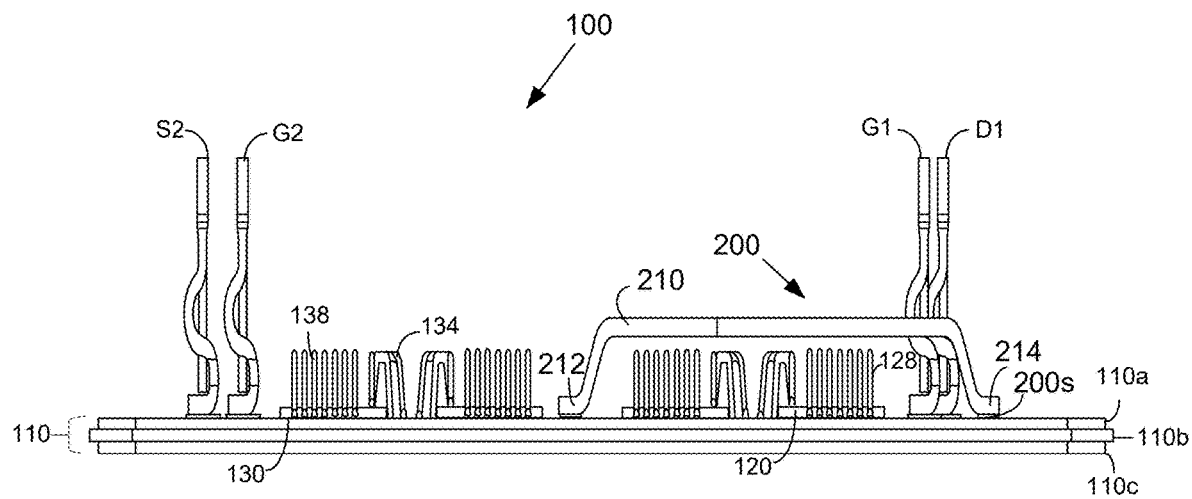
FIG. 1E illustrates a cross-sectional view of the circuit of FIG. 1D.
Figure 4:
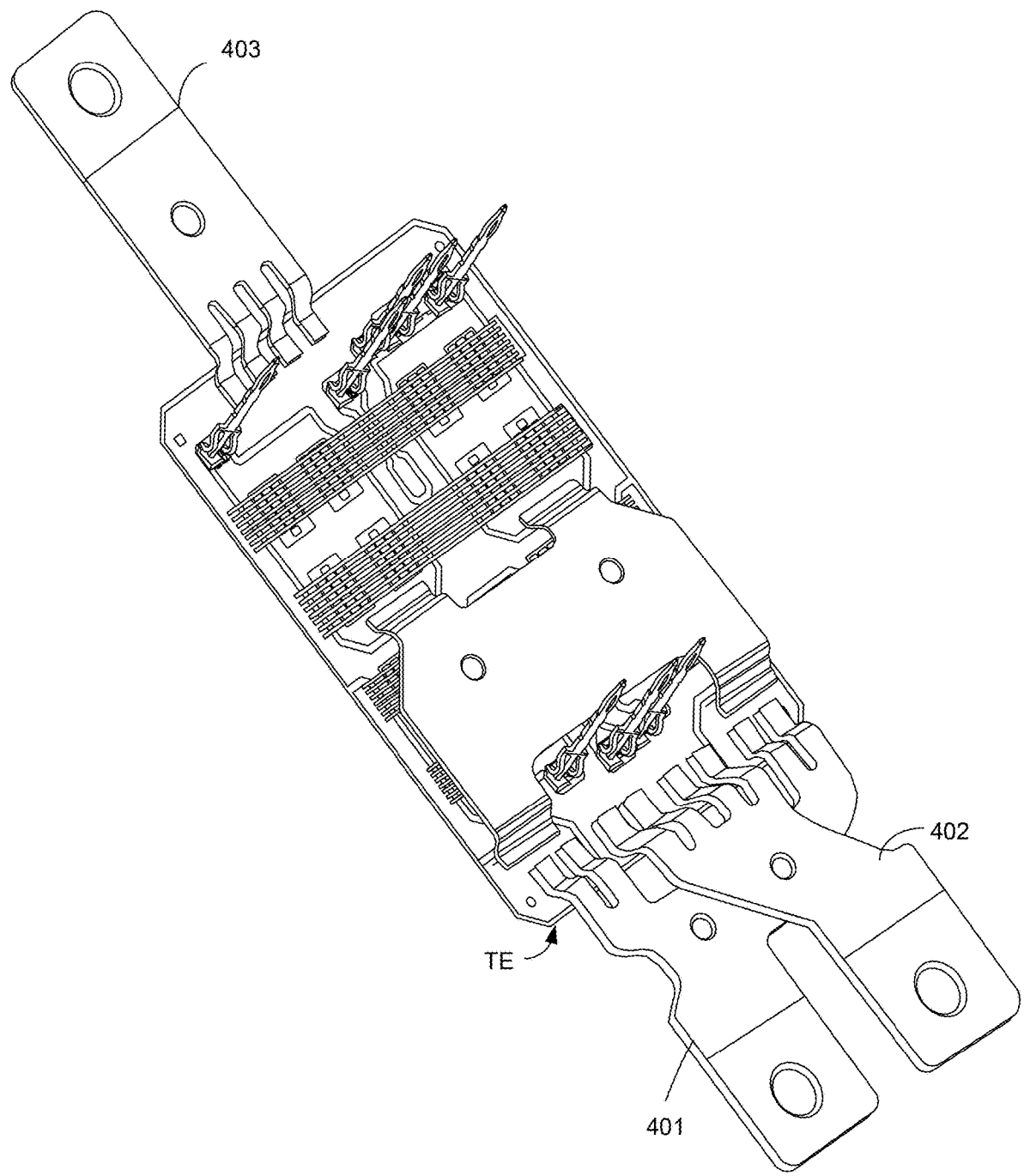
FIG. 4 illustrates an example power module including external terminals connected to a circuit assembled on a substrate.
Figure 5A:
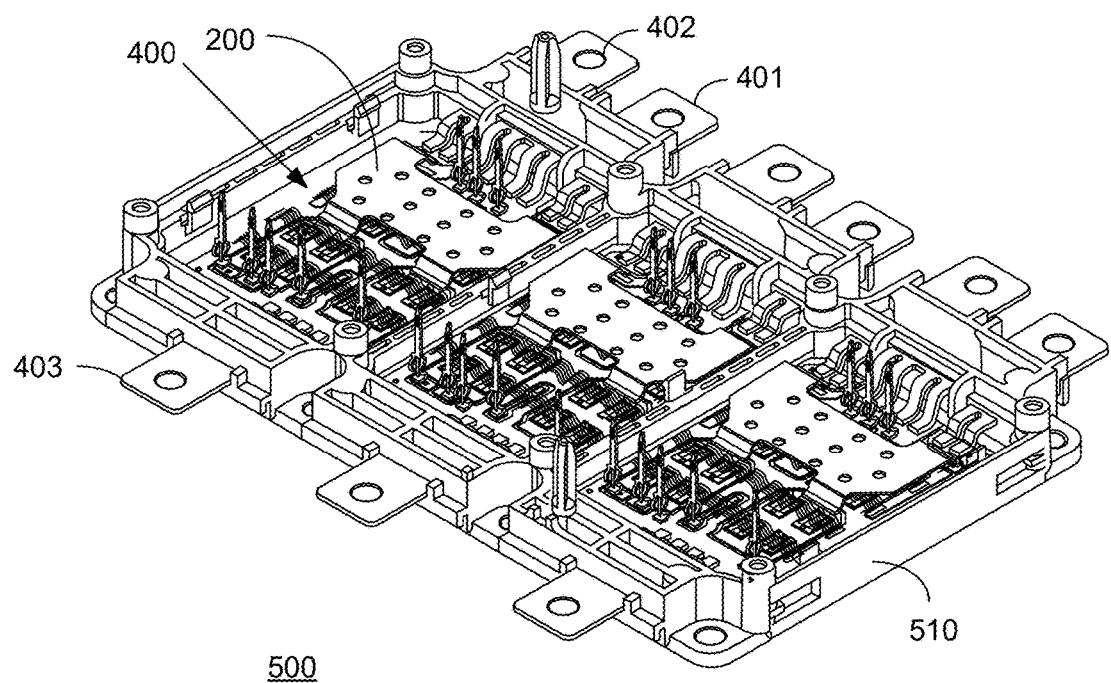
FIGS. 5A and 5B illustrate an example power module including external terminals connected to a circuit assembled on a substrate.
Figure 5B:
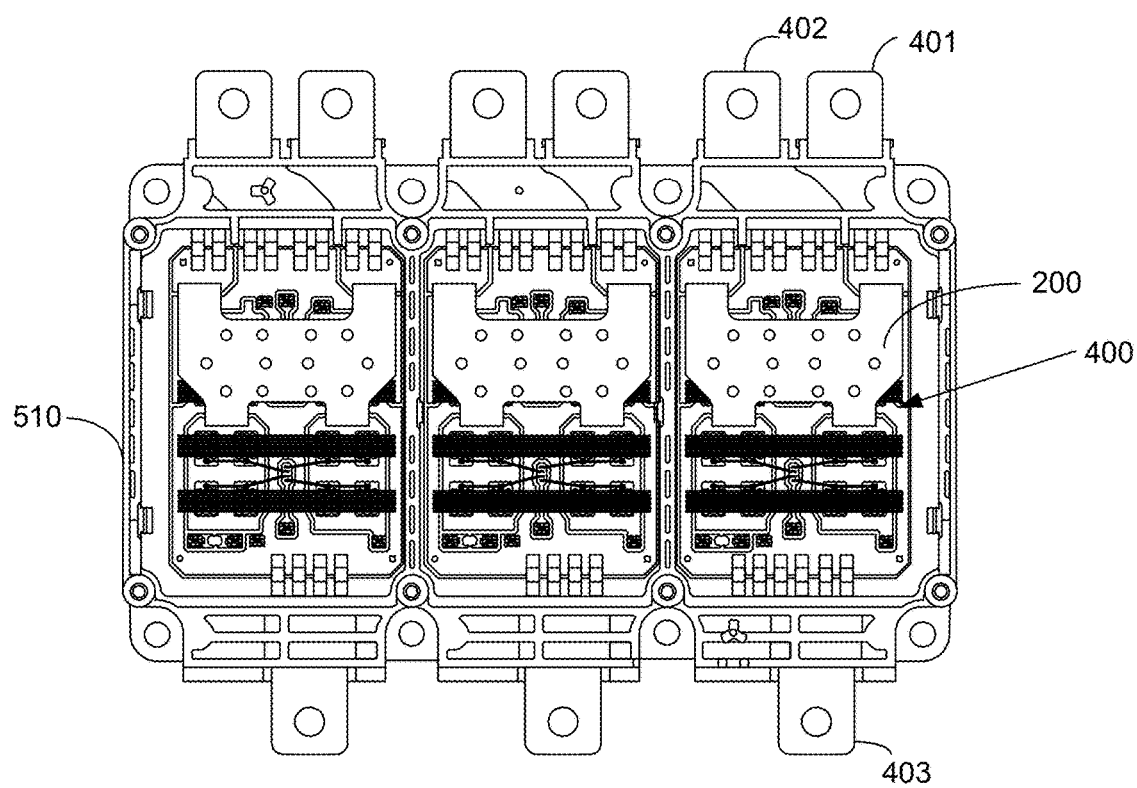

As shown in cross sectional view in FIG. 1E, substrate 110 may include metal layers (e.g., metal layers 110a and 110c) (e.g., copper sheets) bonded to a top side and a bottom side of a non-conducting carrier layer (e.g., a ceramic tile 110b), respectively. Metal layer 110c on the bottom side of the ceramic tile may serve as a heat radiating surface when the circuit is assembled as a single-side directly cooled (SSDC) power module (FIG. 4, FIGS. 5A and 5B). Metal layer 110a on the top side of ceramic tile 110b can be patterned to form the several mutually isolated conductive pads (and traces) on which the circuit devices and components (e.g., MOSFET devices, external terminals, etc.) of the circuit are disposed.

FIG. 1B shows an example layout 10 of mutually isolated conductive pads formed (e.g., by lithography and etching) on substrate 110. Substrate 110 may have a rectangular shape with a height H and a width W. Layout 10 can include conductive pads (e.g., conductive terminal pad 111-1, conductive terminal pad 112, and conductive terminal pad 111-2) disposed along the top edge (e.g., edge TE) of substrate 110. Conductive terminal pad 111-1, conductive terminal pad 112, and conductive terminal pad 111-2 are adapted for attachment to external terminals of the circuit package (e.g., external terminal 401, external terminal 402, and external terminal 403, power module 400, FIG. 4). For geometrical symmetry and balancing of current flow through the circuit, a single conductive terminal pad for attachment to an external terminal (e.g., a DC+ terminal) may be split into two symmetrically located pads (conductive terminal pad 111-1, conductive terminal pad 111-2) in layout 10. Layout 10 further includes a first conductive pad (e.g., conductive pad 113) in an upper portion 110U of the substrate, and a second conductive pad (e.g., conductive pads 114-1, 114-2) in a lower portion 110L of the substrate. The first conductive pad (e.g., conductive pad 113) and the second conductive pad (e.g., conductive pad 114-1, 114-2) are adapted to receive devices (e.g., MOSFETs) of the circuit. For geometrical symmetry and balancing of current flow through the circuit, the second conductive pad may be split into two symmetrically located pads (i.e., conductive pad 114-1, 114-2) in layout 10. Conductive pad 113 and conductive pad 114-1, 114-2, may be adapted to receive a configuration of devices (e.g., MOSFETs) of the circuit that is symmetric (e.g., bilateral symmetric about a median axis of the substrate represented by vertical axis V in FIG. 1B). Layout 10 also includes a third conductive pad 115 and a fourth conductive pad 116 adapted for connection to gates of the devices that are placed on conductive pad 113 and conductive pad 114, respectively. Layout 10 further includes a conductive pad 117 and a conductive pad 118 adapted to receive a diode (e.g., a thermistor) that may be included in the circuit package. In example implementations, a portion of conductive pad 113 (e.g., conductive pad portion 113B) extending to a bottom edge (edge BE) of the substrate may be adapted to be attached to an external terminal (e.g., an AC terminal) of the circuit package.

FIG. 1C shows a top view of substrate 110 after the devices and components of circuit 100 (e.g., semiconductor dies, MOSFETs) are assembled on substrate 110 and interconnected, for example, by wire bonds (but before conductive bridge 200 is attached). The wire bonds may include wires made of aluminum, copper or any other metal or metal alloy. In example implementations, the wire bonds may be made with aluminum wires.

For example, at least one device (e.g., eight MOSFETs, device 120) of the power circuit corresponding to low-side FET switches are placed (drain-side down) on the first conductive pad (i.e., conductive pad 113). In other words, the first conductive pad (i.e., conductive pad 113) forms the drain contact to each of the MOSFETs (e.g., device 120). Each of the MOSFETs may have a gate contact (e.g., gate contact 122) and several source contacts (e.g., source contact 126) on the top side of the device. Each MOSFET may, for example, have two sets of six source contacts on the top side of the MOSFET. As shown in the FIG. 1C, the gates (e.g., gate contact 122) of the MOSFETs (e.g., device 120) disposed on conductive pad 113 are interconnected to gate contacts of other MOSFETs (e.g., device 120) and to an adjacent conductive pad (e.g., third conductive pad 115) by wire bonds 124. In some implementations, one or more gates (e.g., gate contact 122) of MOSFETs disposed on conductive pad 113 may be individually wire bonded to an adjacent conductive pad (e.g., third conductive pad 115) without direct wire bond interconnections to gate contacts of other MOSFETs.

Further, the sources (e.g., source contact 126) of each MOSFET (e.g., device 120) disposed on conductive pad 113 are interconnected to source contacts of other MOSFETs and to an adjacent conductive pad (e.g., conductive terminal pad 112) by wire bonds 128. In some implementations, one or more sources (e.g., source contact 126) of MOSFETs disposed on conductive pad 113 may be individually wire bonded to an adjacent conductive pad (e.g., conductive terminal pad 112) without direct wire bond interconnections to source contacts of other MOSFETs.

Source, gate and drain control signal pins (e.g., pin S1, pin G1, and pin D1) are attached to conductive terminal pad 112, third conductive pad 115 and conductive pad 113, respectively, for input/output signals from or to the sources, gates and drains of the MOSFETs (e.g., device 120) disposed on the first conductive pad (e.g., conductive pad 113). These signal pins may extend perpendicularly to substrate 110 in a circuit package.

Further, for example, at least one device (e.g., eight MOSFETs, device 130) of the power circuit corresponding to high-side FET switches may be placed (drain-side down) on the second conductive pad (i.e., conductive pad 114-1, 114-2). In other words, the second conductive pad (i.e., conductive pad 114-1, 114-2) forms the drain contact to each of the MOSFETs (e.g., device 130). Each of the MOSFETs may have a gate contact (e.g., gate contact 132) and several source contacts (e.g., source contact 136) disposed on the top side of the device. Each MOSFET may, for example, have two sets of six source contacts on the top side. As shown in the FIG. 1C, the gates (e.g., gate contact 132) of the MOSFETs (e.g., device 130) disposed on conductive pad 114-1, 114-2 are interconnected to gate contacts of other MOSFETs and to an adjacent conductive pad (e.g., fourth conductive pad 116) by wire bonds 134. Further, the sources (e.g., source contact 136) of each MOSFET (e.g., device 130) disposed on conductive pad 113 are interconnected to source contacts of other MOSFETs and to an adjacent conductive pad (e.g., conductive pad 113) by wire bonds 138. This arrangement effectively connects the sources of the MOSFETs (e.g., device 130) disposed on conductive pad 114-1, 114-2 to the drains of the MOSFETs (e.g., device 120) disposed drain side down on conductive pad 113.

In some implementations, one or more gates (e.g., gate contact 132) of MOSFETs disposed on conductive pad 114-1, 114-2 may be individually wire bonded to an adjacent conductive pad (e.g., fourth conductive pad 116) without direct wire bond interconnections to gate contacts of other MOSFETs.

In some implementations, one or more sources (e.g., source contact 136) of MOSFETs disposed on conductive pad 114-1, 114-2 may be individually wire bonded to an adjacent conductive pad (e.g., conductive pad 113) without direct wire bond interconnections to source contacts of other MOSFETs.

Source, gate and drain control pins (e.g., pin S2, pin G2, and pin D2) are attached to conductive pad 113, fourth conductive pad 116 and the second conductive pad (e.g., conductive pad 114-1, 114-2) respectively, for control input/output signals to or from the sources, gates and drains of the MOSFETs (e.g., device 130) disposed on second conductive pad (e.g., conductive pad 114-1, 114-2). These pins may extend perpendicularly to substrate 110 in a circuit package.

Further, as shown in FIG. 1C, circuit 100 may include a thermistor 119 disposed across conductive pad 117 and conductive pad 118. Control signal pins (e.g., pins T1 and T2) may be attached conductive pad 117 and conductive pad 118, for example, for electrical measurements across the terminals of thermistor 119.

FIG. 1D shows a top view of the circuit assembled on substrate 110 after a conductive bridge (e.g., conductive bridge 200, FIG. 2) is attached to substrate 110 to provide a current path from a conductive terminal pad (e.g., conductive terminal pad 111-1, 111-2) to the second conductive pad (e.g., conductive pad 114-1, 114-2). FIG. 1E shows a cross-sectional of the circuit assembled on substrate 110 after conductive bridge 200 is attached to substrate 110.

Conductive bridge 200 (shown in FIG. 2) may be made of a metal or a metal alloy (e.g., aluminum, copper, etc.). Conductive bridge 200 may include an elevated span (e.g., plate 210) that is elevated, for example, to a height h above footers (e.g., footer 212, footer 214) by pillars 216. In example implementations, height h may be in a range between 2 mm and 10.0 mm (e.g., about 5 mm). In example implementations, plate 210 may include at least one aperture (e.g., aperture 220). These aperture may facilitate handling and placement of conductive bridge 200 on the substrate in assembly operations.

Conductive bridge 200 may be attached to substrate 110, for example, by coupling (e.g., soldering) footer 212 and footer 214 to the terminal (e.g., conductive terminal pad 111-1, 111-2) and the second conductive pad (e.g., conductive pad 114-1, 114-2). FIG. 1E shows for example, conductive bridge 200 attached (coupled) to substrate 110 with a solder (e.g., solder 200s). In some implementations, footer 212 and footer 214 may be ultrasonically welded to the substrate. The elevated span (e.g., plate 210) of conductive bridge 200 may be elevated to a height h that is above the devices (e.g., devices 120) and the source and gate wire bonds (e.g., wire bonds 128 and wire bond 124) of the portion of the circuit (e.g., sub circuit 100A) assembled on the first conductive pad (e.g., conductive pad 113).

Conductive bridge 200 may provide a direct low resistance and low inductance path for current flow (via plate 210 elevated and extending above the first conductive pad) from conductive terminal pad 111-1, 111-2) (e.g., DC+ terminal) to the portion of the circuit (e.g., sub circuit 100B, device 130) assembled on the second conductive pad (e.g., conductive pad 114-1, 114-2).

Figure 1F:
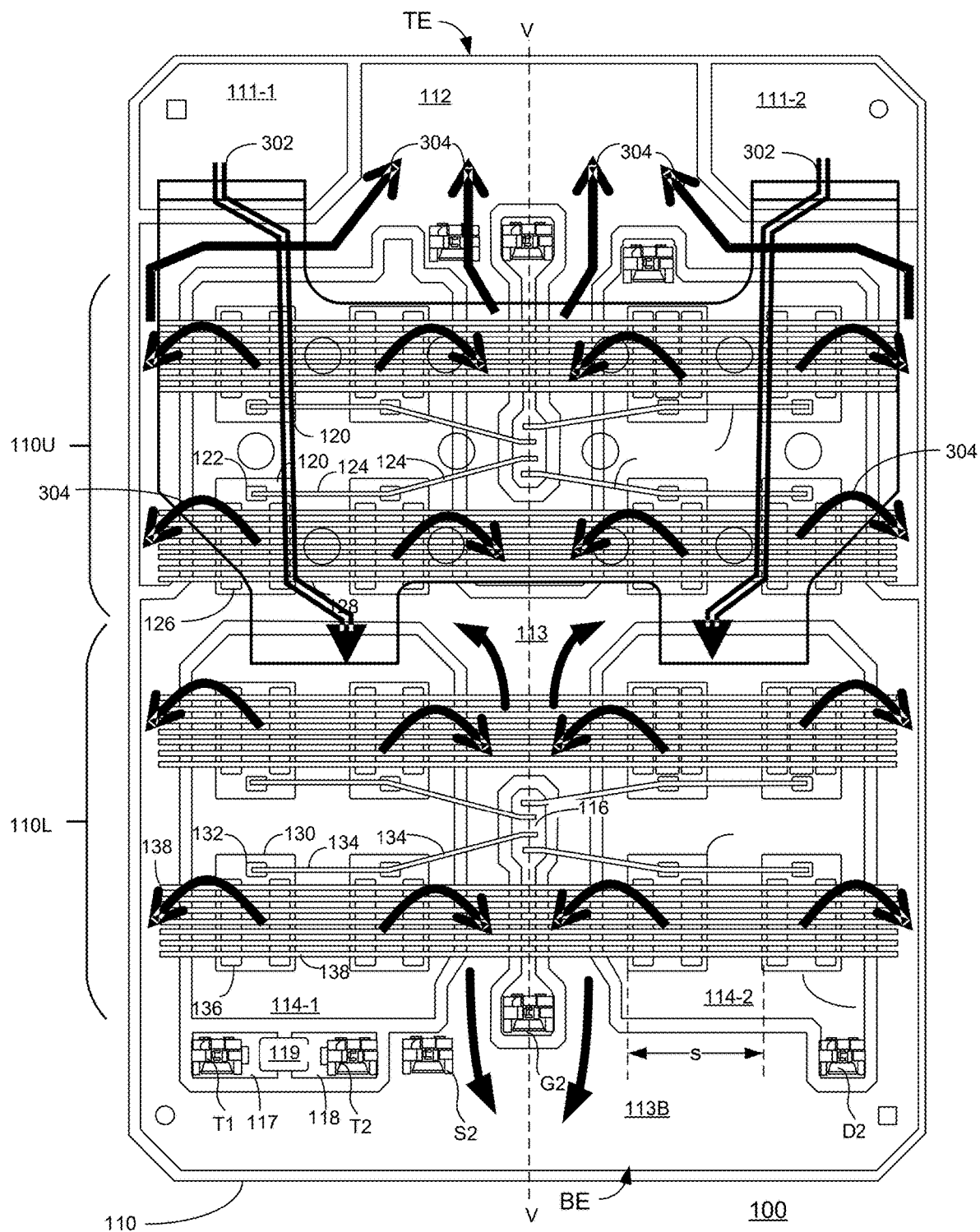
FIG. 1F schematically illustrates example current flows in the circuit of FIG. 1D.
Figure 2:
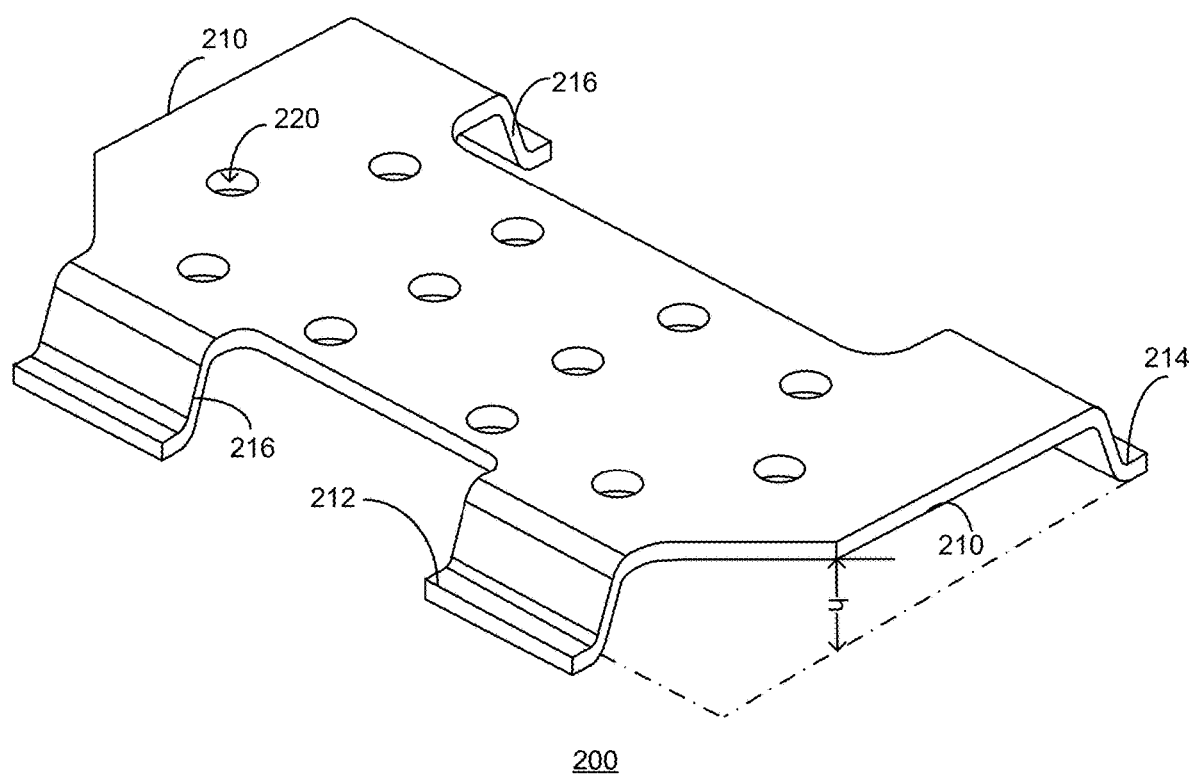
FIG. 2 illustrates an example conductive bridge.

FIG. 1F shows a schematic representation of current flows to and form from the terminals of the circuit. In FIG. 1F, current flow into the circuit from conductive terminal pad 111-1, 111-2 (e.g., a DC+ terminal) via plate 210 is schematically represented by downward pointing arrows (e.g., arrow 302). Current flowing out of the circuit from the first conductive pad (e.g., conductive pad 113) via conductive terminal pad 112 (e.g., a DC-terminal) is represented by arrows (e.g., arrow 304).

Use of the elevated span (e.g., a conductive plate, plate 210) for current flow from conductive terminal pad 111-1, 111-2 directly to the second conductive pad (e.g., conductive pad 114-1, 114-2) can avoid the use of narrow traces around the first conductive pad that would be otherwise needed to connect conductive terminal pad 111-1, 111-2 (e.g., DC+ terminal) to the portion of the circuit (e.g., device 130) disposed on the second conductive pad (e.g., conductive pad 114-1, 114-2). More space can become available for a larger spacing (spacing s) between the MOSFETs (e.g., device 120) on conductive pad 113. The larger spacing between the MOSFETs (enabled by making more surface area available by not using narrow traces around the first conductive pad) can improve heat dissipation and temperature performance characteristics of the assembled circuit. In example implementations, the MOSFETs may be spaced at least a few tenths of a millimeter apart (e.g., 0.3 mm apart), for example, along an axis perpendicular to the vertical axis V).

Further, the small distance (e.g., height h between plate 210 elevated above the first conductive pad) can reduce a distance between the current flowing into the circuit from conductive terminal pad 111-1, 111-2 (e.g., DC+ terminal) and the current flowing out of the circuit, for example, from the first conductive pad via the conductive terminal pad 112 (e.g., the DC− terminal). This distance reduction can modify the coupling of the incoming and outgoing currents and result in a reduction of circuit inductance.

Figure 3:
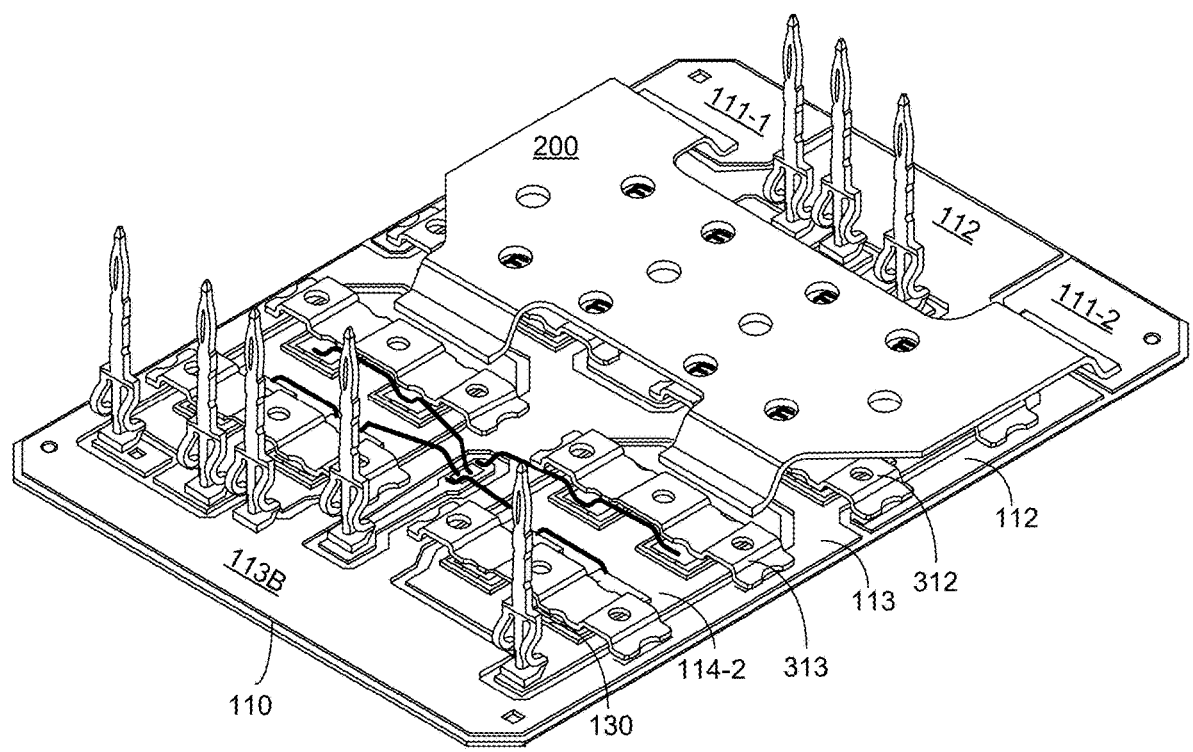
FIG. 3 illustrates a perspective top view of an example power circuit assembled on a substrate using connector clips to connect sources of devices in the circuit.

As shown in FIG. 3, in some example implementations, source connector clips (e.g., connector clip 312, connector clip 313) may be used to interconnect source contacts (e.g., source contact 126, source contact 136) of the devices (e.g., device 120, device 130) and to connect to an adjacent conductive pad (e.g., conductive terminal pad 112, conductive pad 113). Use of the source connector clips may simplify assembly of the circuit by obviating the need to make multiple wire bonds (e.g., wire bond 128 or wire bond 138) between the source contacts, and to the adjacent conductive pad. Further, use of the source connector clips instead of the source wire bonds may reduce circuit inductance.

FIG. 4 shows an example power module 400 including external terminals connected to circuit 100 assembled on substrate 110. Circuit 100 may, for example, be a half bridge circuit (or a half bridge driver).

In power module 400, external terminals (e.g., an external terminal 401, an external terminal 402, and an external terminal 403) are attached to the conductive pads of substrate 110. For example, external terminal 401 (e.g., a DC+ terminal) may be attached to conductive terminal pad 111-1, 111-2 at the top edge (edge TE) of the substrate. External terminal 402 (e.g., a DC− terminal) may be attached to conductive terminal pad 112 at the top edge (edge TE) of the substrate. Further, external terminal 403 (e.g., an AC terminal) may be attached to a portion of conductive pad 113 (e.g., conductive pad portion 113B) extending to the bottom edge (edge BE) of the substrate. The external terminals (e.g., terminal 401, terminal 402, and terminal 403) may be made of a metal (e.g., aluminum, copper, etc.) or a metal alloy.

FIGS. 5A and 5B shows a perspective top view and a plan view of an example power module package 500 (e.g., a SSDC package), respectively. Power module package 500 can include a combination of half bridge circuits (e.g., power module 400) configured as a full bridge circuit. In power module package 500, three half bridge circuits (e.g., power module 400) may, for example, be enclosed in a frame or casing (e.g., casing 510) made of plastic or metal. External terminals (e.g., external terminal 401, external terminal 402, and external terminal 403) of each of three half bridge circuits (e.g., power module 400) extend out of the package casing (e.g., casing 510). The combination of the three half bridge circuits (e.g., power modules 400) in power module package 500 can be configured to function as a full bridge circuit.

In power module package 500, heat dissipation may occur through the bottom surfaces of the substrates (substrate 110) of the power modules (e.g., power module 400). Further, a heat sink or heat slug (not shown) may be attached to casing 510 for heat dissipation.

Further, for mechanical protection, an encapsulation material (e.g., a gel or a molding compound) (not shown) may be applied on top of the power modules (power modules 400) assembled in power module package 500.

Figure 6:
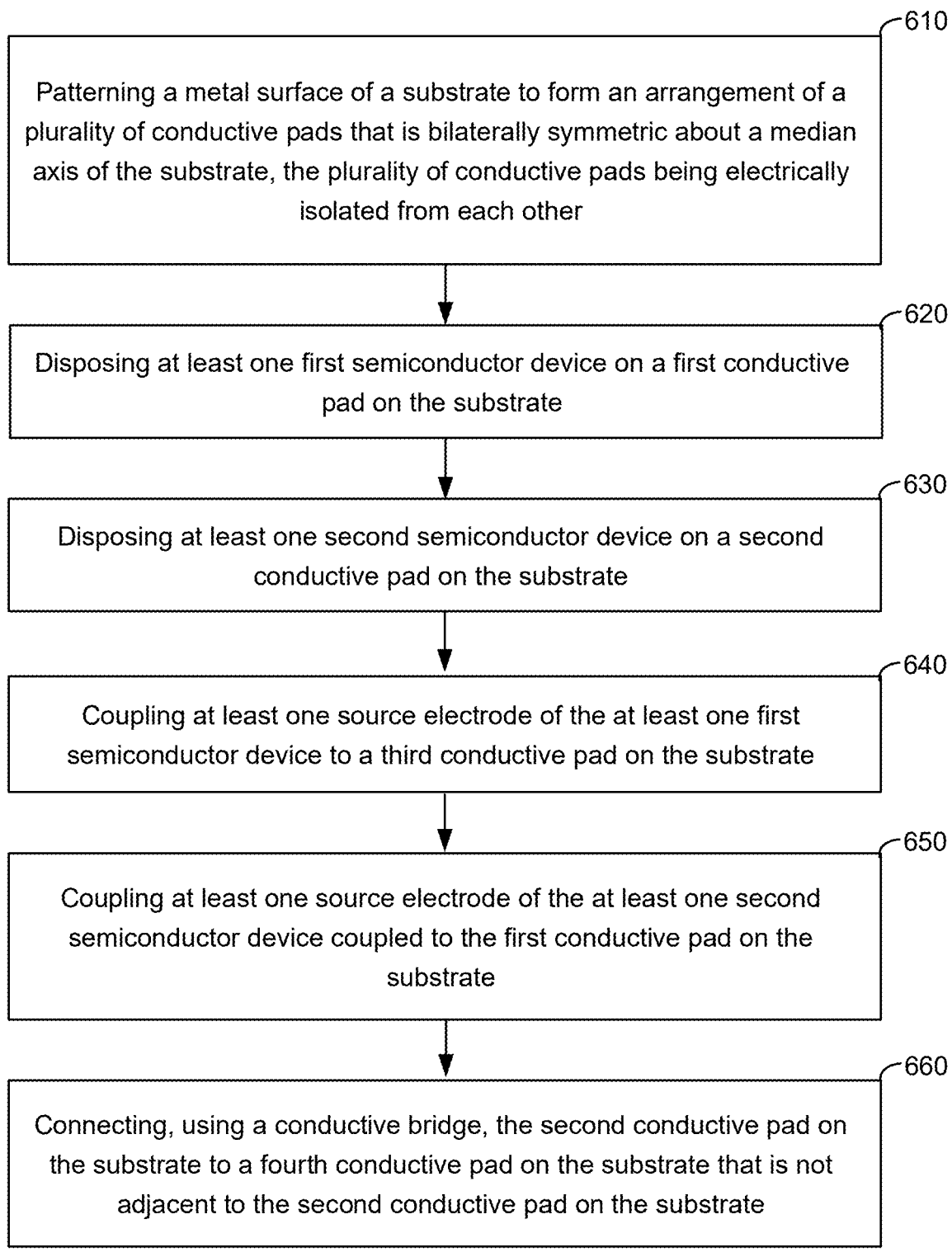
FIG. 6 illustrates an example method for assembling a power circuit module.

FIG. 6 shows an example method 600 for assembling a power circuit module (e.g., power module 400).

Example method 600 includes patterning a metal surface of a substrate to form an arrangement of a plurality of conductive pads that is bilaterally symmetric about a median axis of the substrate, the plurality of conductive pads being electrically isolated from each other (610). Method 600 further includes disposing at least one first semiconductor device on a first conductive pad on the substrate (620), disposing at least one second semiconductor device on a second conductive pad on the substrate (630). Method 600 further includes coupling at least one source electrode of the at least one first semiconductor device coupled to a third conductive pad (e.g., a DC− terminal pad) on the substrate (640), coupling at least one source electrode of the at least one second semiconductor device to the first conductive pad on the substrate (650). Method 600 further includes using a conductive bridge to connect the second conductive pad on the substrate to a fourth conductive pad (e.g., a DC+ terminal pad) on the substrate that is not adjacent to the second conductive pad on the substrate (660).

Method 600 may also include attaching a first external power terminal to the fourth conductive pad on the substrate; attaching a second external power terminal to the third conductive pad on the substrate; and attaching a third external power terminal to the second conductive pad on the substrate.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit module comprising:
   a substrate with a patterned metal surface, the patterned metal surface including a conductive terminal pad, a first conductive pad, and a second conductive pad, the second conductive pad being non-adjacent to the conductive terminal pad;
   a first circuit portion assembled on the first conductive pad;
   a second circuit portion assembled on the second conductive pad;
   a conductive bridge coupled to the conductive terminal pad and the second conductive pad, the conductive bridge including an elevated span extending above and across the first conductive pad, and
   at least one first semiconductor device die is disposed with a drain-side down on of the first conductive pad, and at least one second semiconductor device die is disposed with a drain-side down on the second conductive pad.

2. The circuit module of claim 1, further comprising, a current path from the conductive terminal pad directly to the second conductive pad through the conductive bridge avoiding use of traces around the first conductive pad for current flow.

3. The circuit module of claim 1, wherein the conductive terminal pad, the first conductive pad, and the second conductive pad are each formed by areas that are bilaterally symmetric about a median axis of the substrate.

4. The circuit module of claim 1, wherein the conductive bridge is made of a metal or a metal alloy.

5. The circuit module of claim 1, wherein the at least one first semiconductor device die has source contacts on a top side that are connected to source contacts of a next first semiconductor device die by first wire bonds or a first connector clip and wherein the at least one second semiconductor device die has source contacts on a top side that are connected to source contacts of a next second semiconductor device die by second wire bonds or a second connector clip.

6. The circuit module of claim 5, wherein the conductive terminal pad is a first conductive terminal pad and wherein the at least one first semiconductor device die has its source contacts connected to a second conductive terminal pad, and the at least one second semiconductor device die has its source contacts connected to the first conductive pad.

7. The circuit module of claim 1, wherein the conductive terminal pad is a first conductive terminal pad, wherein a source signal pin for the at least one first semiconductor device die is attached to a second conductive terminal pad, and wherein a source signal pin for the at least one second semiconductor device die is attached to the first conductive pad.

8. The circuit module of claim 7, wherein the at least one first semiconductor device die has its gate contact connected to a third conductive pad disposed on the substrate, and the at least one second semiconductor device die has its gate contact connected to a fourth conductive pad disposed on the substrate.

9. The circuit module of claim 1, wherein the at least one first semiconductor device die has a gate contact on a top side that is connected to a gate contact of a next first semiconductor device die by a first wire bond, and wherein the at least one second semiconductor device die has a gate contact on a top side that is connected to a gate contact of a next second semiconductor device die by a second wire bond.

10. The circuit module of claim 1, wherein the substrate is one of a printed circuit board or a direct bonded metal (DBM) substrate.

11. The circuit module of claim 1 configured as a single side directly cooled (SSDC) power module.

12. A circuit module comprising:
a substrate with a patterned metal surface, the patterned metal surface including a conductive terminal pad, a first conductive pad, and a second conductive pad, the second conductive pad being non-adjacent to the conductive terminal pad;
a first circuit portion assembled on the first conductive pad;
a second circuit portion assembled on the second conductive pad;
a conductive bridge coupled to the conductive terminal pad and the second conductive pad, the conductive bridge including an elevated span extending above and across the first conductive pad; and
at least one first semiconductor device die is disposed on the first conductive pad, and at least one second semiconductor device die is disposed on the second conductive pad,
the at least one first semiconductor device die or the at least one second semiconductor device die include at least one of an insulated-gate bipolar transistor (IGBT), a fast recovery diode (FRD), a silicon metal-oxide-semiconductor field effect transistor (silicon MOSFET), and a silicon carbide MOSFET.

13. A power circuit package comprising:
a plurality of conductive pads disposed on a surface of a substrate, the plurality of conductive pads including a conductive terminal pad disposed in an edge portion of the substrate along a top edge of the substrate, a first conductive pad disposed in an upper portion of the substrate next to the edge portion, and a second conductive pad disposed in a lower portion of the substrate next to the upper portion;
a first sub circuit assembled on the first conductive pad, wherein the first sub circuit is a low side driver circuit and includes a low side semiconductor switching device disposed on the first conductive pad;
a second sub circuit assembled on the second conductive pad, wherein the second sub circuit is a high side driver circuit and includes a high side semiconductor switching device disposed on the second conductive pad; and
a conductive bridge coupled to the conductive terminal pad and the second conductive pad, the conductive bridge including a span extending above first conductive pad and the first sub circuit assembled on the first conductive pad.

14. The power circuit package of claim 13, wherein the second conductive pad is not adjacent to the conductive terminal pad, and the power circuit package further comprises:
a current path from the conductive terminal pad directly to the second conductive pad through the conductive bridge avoiding use of traces around the first conductive pad on the substrate for current flow.

15. The power circuit package of claim 13, wherein the low side semiconductor switching device and the high side semiconductor switching device include at least one of an insulated-gate bipolar transistor (IGBT), a fast recovery diode (FRD), a silicon metal-oxide-semiconductor field effect transistor (silicon MOSFET), and a silicon carbide MOSFET.

16. The power circuit package of claim 13, wherein the substrate is direct bonded (DBM) substrate, and the power circuit package is configured as a single side directly cooled (SSDC) power circuit package.

* * * * *